United States Patent [19]

Tanaka et al.

[11] Patent Number: 4,863,657
[45] Date of Patent: Sep. 5, 1989

[54] METHOD OF MAKING SEMI-CONDUCTOR DIFFUSION FURNACE COMPONENTS

[75] Inventors: Takashi Tanaka; Yoshiyuki Watanabe, both of Oguni, Japan

[73] Assignee: Toshiba Ceramics Co., Ltd., Tokyo, Japan

[21] Appl. No.: 225,028

[22] Filed: Jul. 27, 1988

Related U.S. Application Data

[63] Continuation of Ser. No. 878,084, Jun. 24, 1986, abandoned.

[30] Foreign Application Priority Data

Jul. 9, 1985 [JP] Japan ................ 60-149346

[51] Int. Cl.$^4$ ............ C04B 35/52; C04B 35/56; C04B 35/64; C04B 41/81
[52] U.S. Cl. ....................... 264/62; 264/63; 264/66; 501/88
[58] Field of Search ............ 264/60, 62, 63, 65, 264/82, 44, 43, 56, 344, 66; 501/88

[56] References Cited

U.S. PATENT DOCUMENTS

| | | | |
|---|---|---|---|
| 2,907,972 | 10/1959 | Schildhauer et al. | 501/88 X |
| 3,495,939 | 2/1970 | Forrest | 264/65 |
| 3,947,550 | 3/1976 | Fitchmun | 264/63 X |
| 3,951,587 | 4/1976 | Alliegro et al. | 432/253 |
| 4,233,256 | 11/1980 | Ohnsorg | 264/44 |
| 4,385,020 | 5/1983 | Morelock | 264/62 |
| 4,482,512 | 11/1984 | Alsop | 264/60 |
| 4,510,191 | 4/1985 | Kagami et al. | 264/60 X |
| 4,532,091 | 7/1985 | Dias et al. | 264/60 X |
| 4,564,496 | 1/1986 | Gupta et al. | 501/88 X |
| 4,619,798 | 10/1986 | Tanaka et al. | 264/62 |
| 4,668,452 | 5/1987 | Watanabe et al. | 264/65 X |
| 4,671,912 | 6/1987 | Komatsu et al. | 264/65 X |
| 4,693,988 | 9/1987 | Boecker et al. | 264/65 X |
| 4,747,863 | 5/1988 | Clasen et al. | 264/56 X |
| 4,753,763 | 6/1988 | Tanaka et al. | 264/82 X |

Primary Examiner—Jan H. Silbaugh
Assistant Examiner—Karen D. Kutach
Attorney, Agent, or Firm—Wegner & Bretschneider

[57] ABSTRACT

A sintered silicon carbide matrix component for a semiconductor diffusion furnace results from sintering a mixture of three types of silicon carbide powder. The mixture includes fine silicon carbide having an average particle size of 0.1–10 microns, intermediate silicon carbide having an average particle size of 12–30 microns and coarse silicon carbide having an average particle size of 40–200 microns. The difference between the average particle sizes of the three types of powder is at least 10 microns.

6 Claims, 1 Drawing Sheet

METHOD OF MAKING SEMI-CONDUCTOR DIFFUSION FURNACE COMPONENTS

This application is a continuation of United States application Ser. No. 878,084, filed June 24, 1986 now abandoned.

BACKGROUND OF THE INVENTION

This invention relates to components for a semi-conductor diffusion furnace and a method for making the components.

U.S. Pat. No. 3,951,587 discloses semi-conductor diffusion furnace components such as a process tube, paddle and boat consisting essentially of a sintered silicon carbide matrix resulting from the sintering of a silicon carbide powder which is made up of approximately 50% by weight of fine silicon carbide having an average particle size of 0.1-8 microns and 50% by weight of coarse silicon carbide having an average particle size of 30-170 microns.

In case of such bimodel approach, homogeneous impregnation cannot be easily carried out so that mechanical strength is apt to be decreased.

SUMMARY OF THE INVENTION

The object of this invention is to provide semi-conductor diffusion furnace components and a method for making the components in which physical characteristics and in particular mechanical strength can be improved.

According to this invention, three type silicon carbide powders are used which consist essentially of coarse silicon carbide powder, intermediate silicon carbide powder and fine silicon carbide powder.

The fine silicon carbide powder has an average particle size of 0.1-10 microns. The intermediate silicon carbide powder has an average particle size of 12-30 microns. The coarse silicon carbide powder has an average particle size of 40-200 microns. Further, a difference between the average particle size of the fine powder and that of the intermediate powder is at least 10 microns and preferably at least 12 microns. A difference between the average particle size of the coarse powder and that of the intermediate powder is at least 10 microns and preferably at least 85 microns.

Preferably, 10 parts of fine powder, 10 parts of intermediate powder and 10 parts of coarse powder are blended and mixed with an organic binder such as phenol resin, polyvinyl alcohol or tar pitch thereby to produce a mixture.

Such a mixture is granulated or pelletized so as to obtain pellets and then formed by a rubber press thereby to obtain a formed body. It is presintered at a temperature of 800°-1200° C. thereby to obtain a presintered body. The presintered body is impregnated with silicon at a temperature of 1500°-1800° C. for the silicidation of the presintered body. It is substantially simultaneously sintered at a temperature of 1500°-1800° C. thereby to produce a sintered body. Prior to the impregnating step, the presintered body is preferably purged by chlorine gas at a temperature of 1500°-1800° C. so as to be purified whereby a high quality of component can be obtained.

According to this invention, as three type silicon carbide powders are used, a semi-conductor diffusion furnace component can have an excellent microstructure so that physical properties are improved. In addition, as they are formed by a rubber press, good and stabilized qualities can be easily obtained.

EXAMPLE 1

Figure 1:
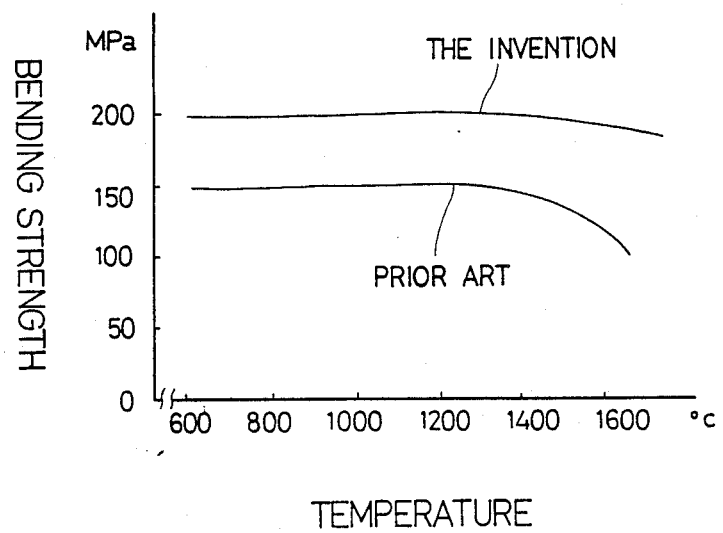
FIG. 1 shows mechanical strength of a semi-conductor component manufactured according to this invention in comparison with that of a prior art component.

A process tube for a semi-conductor diffusion furnace is manufactured as follows:

A mixture is prepared from the following combination of materials:

(a) fine silicon carbide powder having an average particle size of 3 microns ....... 10 parts by weight;

(b) intermediate silicon carbide powder having an average particle size of 15 microns .... 10 parts by weight; and (c) coarse silicon carbide powder having an average particle size of 100 microns ...... 10 parts by weight.

The mixture is admixed with phenol resin and thereafter granulated thereby to produce pellets in a well-known manner. After such pellets are dried, they are formed in the shape of a process tube by means of a conventional rubber press thereby to produce a formed body. If desired, it is machined or adhered to some part. After that, it is presintered at a temperature of 800° C. thereby to obtain a presintered body, and then it is purged by means of chlorine gas at 1500° C. so as to be purified. Such a presintered and purified body is impregnated with silicon at 1,700° C. for the silicidation of the presintered body. It is simultaneously sintered at 1,700° C. If desired, it is finally finished by grinding a surface thereof.

The bending strength of the process tube so produced is as shown in FIG. 1. The process tube manufactured according to this invention which is purged by chlorine gas is compared with a process tube manufactured according to the above-stated prior art. As can be seen from FIG. 1, the mechanical strength of a process tube according to this invention is remarkably improved particularly at a high temperature range.

We claim:

1. A method for making semi-conductor diffusion components, comprising the steps of:

(a) obtaining, as separate powders, (i) fine silicon carbide having an average particle size of 0.1-10 microns, (ii) intermediate silicon carbide having an average particle size of 12-30 microns, and (iii) coarse silicon carbide having an average particle size of 40-200 microns, wherein the average particle sizes of the fine, intermediate and coarse silicon carbide differ from each other by at least 10 microns;

(b) blending 10 parts by weight of each of the three separate powders to form a mixture;

(c) admixing an organic binder with the mixture;

(d) thereafter granulating the mixture thereby to produce pellets;

(e) preforming the pellets by a rubber press thereby to produce a formed body;

(f) presintering the formed body thereby to produce a presintered body;

(g) impregnating the presintered body with silicon; and (h) sintering the presintered body, to produce semi-conductor diffusion furnace components having improved mechanical strength, physical characteristics, and excellent microstructure.

2. The method of claim 1, wherein a difference between the average paticle size of the fine silicon carbide and the average particle size of the intermediate silicon carbide is at least 12 microns.

3. The method of claim 1, wherein a difference between the average particle size of the coarse silicon carbide and the average particle size of the intermediate silicon carbide is at least 85 microns.

4. The method of claim 1, wherein the impregnating step is substantially simultaneous with the sintering step.

5. The method of claim 4, wherein the presintered body is sintered at a temperature of 1500°–1800° C.

6. The method of claim 5, wherein the formed body is presintered at a temperature of 800°–1200° C.